(12) United States Patent
Kijima

(10) Patent No.: US 7,781,073 B2
(45) Date of Patent: Aug. 24, 2010

(54) ORGANIC ELECTROLUMINESCENCE ELEMENT AND DISPLAY DEVICE CONSTRUCTED THEREFROM

(75) Inventor: Yasunori Kijima, Tokyo (JP)

(73) Assignee: Sony Corporation, Tokyo (JP)

( * ) Notice: Subject to any disclaimer, the term of this patent is extended or adjusted under 35 U.S.C. 154(b) by 780 days.

(21) Appl. No.: 11/132,816

(22) Filed: May 19, 2005

(65) Prior Publication Data

US 2005/0260451 A1 Nov. 24, 2005

(30) Foreign Application Priority Data

May 24, 2004 (JP) .................... P2004-153203

(51) Int. Cl.
*H01L 51/54* (2006.01)
(52) U.S. Cl. ............... 428/690; 428/917; 313/504; 313/506
(58) Field of Classification Search ......... 428/690, 428/917; 427/58, 66; 313/502–509; 257/40, 257/88–103, E51.001–E51.052; 252/301.16–301.35
See application file for complete search history.

(56) References Cited

U.S. PATENT DOCUMENTS

| | | | | |
|---|---|---|---|---|
| 5,639,914 A * | 6/1997 | Tomiyama et al. | ......... | 564/309 |
| 6,344,283 B1 * | 2/2002 | Inoue et al. | ......... | 428/690 |
| 6,717,358 B1 * | 4/2004 | Liao et al. | ......... | 313/504 |
| 6,720,573 B2 * | 4/2004 | Son et al. | ......... | 257/40 |
| 6,872,472 B2 * | 3/2005 | Liao et al. | ......... | 428/690 |
| 2003/0127967 A1 * | 7/2003 | Tsutsui et al. | ......... | 313/498 |
| 2004/0027059 A1 * | 2/2004 | Tsutsui | ......... | 313/504 |
| 2004/0183066 A1 * | 9/2004 | Klubek et al. | ......... | 257/40 |
| 2006/0087225 A1 * | 4/2006 | Liao et al. | ......... | 313/504 |
| 2006/0091794 A1 * | 5/2006 | Agostinelli et al. | ......... | 313/506 |
| 2006/0240277 A1 * | 10/2006 | Hatwar et al. | ......... | 428/690 |
| 2006/0244370 A1 * | 11/2006 | Tyan et al. | ......... | 313/506 |
| 2007/0149816 A1 * | 6/2007 | Kusano et al. | ......... | 564/434 |
| 2007/0181887 A1 * | 8/2007 | Kijima et al. | ......... | 257/79 |

FOREIGN PATENT DOCUMENTS

| | | |
|---|---|---|
| JP | 1994-188073 | 7/1994 |
| JP | 1997-017574 | 1/1997 |
| JP | 1999-176577 | 7/1999 |
| JP | 2001-085165 | 3/2001 |
| JP | 2002-313579 | 10/2002 |
| JP | 2003-045676 | 2/2003 |
| JP | 2003-519432 | 6/2003 |
| JP | 2003-264085 | 9/2003 |

(Continued)

OTHER PUBLICATIONS

Li et al., "Synthesis and Functional Properties of Strongly Luminescent Diphenylamino End-Capped Oligophenylenes," Journal of Organic Chemistry, vol. 69, No. 3, pp. 921-927, Feb. 2004.*

(Continued)

*Primary Examiner*—Dawn Garrett
(74) *Attorney, Agent, or Firm*—Sonnenschein Nath & Rosenthal LLP

(57) ABSTRACT

A display device having a cathode, an anode, and at least two light emitting units in between the cathode and the anode.

18 Claims, 3 Drawing Sheets

FOREIGN PATENT DOCUMENTS

| | | |
|---|---|---|
| JP | 2003-272860 | 9/2003 |
| JP | 2004-083481 | 3/2004 |
| WO | 98-30071 | 7/1998 |
| WO | WO03-044829 | 5/2003 |
| WO | 2005-063684 | 7/2005 |

OTHER PUBLICATIONS

Japanese Office Action dated May 30, 2008 for Application No. 2004-153203.

Office Action for Japanese Application No. 2004-153203 dated Sep. 11, 2009.

* cited by examiner

FIG. 6 - PRIOR ART

ORGANIC ELECTROLUMINESCENCE ELEMENT AND DISPLAY DEVICE CONSTRUCTED THEREFROM

BACKGROUND OF THE INVENTION

The present invention relates to a display device for colored displays and the like and more particularly to a light emitting display having an organic layer.

Recently, more and more researches on organic electroluminescence devices are made in view of their outstanding characteristics such as capability of being driven with low DC voltage, thin form, and self luminous property.

A conventional display device based on organic electroluminescence is shown in FIG. 6. The display device 1 includes a substrate 2, an anode 3, an organic layer 4, and a cathode 5, which are placed one over another. The anode 3 is a transparent electrode made of ITO (indium tin oxide). The organic layer 4 is composed of a hole injection layer 4a, a hole transporting layer 4b, and an emitting layer 4c to transport electrons, which are placed one over another. In such a device, electrons injected from the cathode and holes injected from the anode recombine in the emitting layer 4c, so that light radiates through the substrate 2. There is another type of display device which is composed of a substrate, a cathode 5, an organic layer 4, and an anode 3, which are placed one over another.

The above-mentioned display device has issues to be solved—extended life and improved reliability. The life of display devices is determined usually by initial deterioration (involving loss of luminance) and subsequent gradual deterioration. In other words, in order to extend the life of display devices, it is important to reduce the rate of initial deterioration and subsequent gradual deterioration.

Also, in order to improve the reliability of display devices, it is desirable to widen the region in which hole-electron recombination takes place so that excitons occur in a wide region. In an actual device, however, emissions are usually localized in the interface between the hole transporting layer and the emitting layer. This is one of the possible reasons for long-term deterioration. Consequently, it is considered that an effective way to reduce long-term deterioration is to protect the light-emitting material from local deterioration with time. In fact, it has been reported that green light-emitting devices greatly improve in reliability if the electron transporting emitting layer is doped with a hole transporting material. (See Applied Physics Letters, vol. 75, No. 2, pp. 172 to 174 {1999) and Applied Physics Letters, vol. 80, No. 5, pp. 725 to 727 (2002))

It has been reported that the device has a thermally stable hole transporting capability if the hole injection layer and hole transporting layer are made of tetraphenylbenzidine compound, triphenylamine trimer, or benzidine dimer. (See Japanese Patent Laid-open No. Hei 7-126615.) Examples of such organic materials include starburst amine skeleton represented by the structural formula (1) below and triphenylamine tetramer represented by the structural formula (2) below.

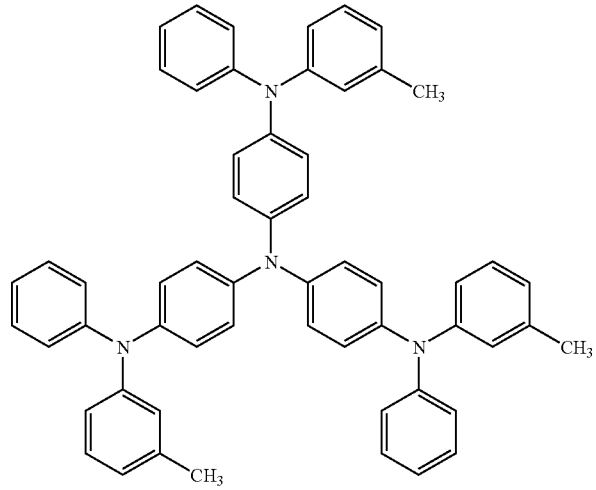

Structural formula (1)

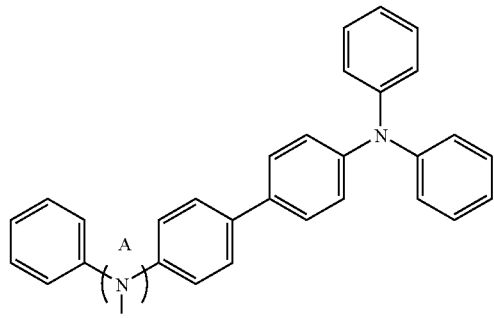

Structural formula (2)

-continued

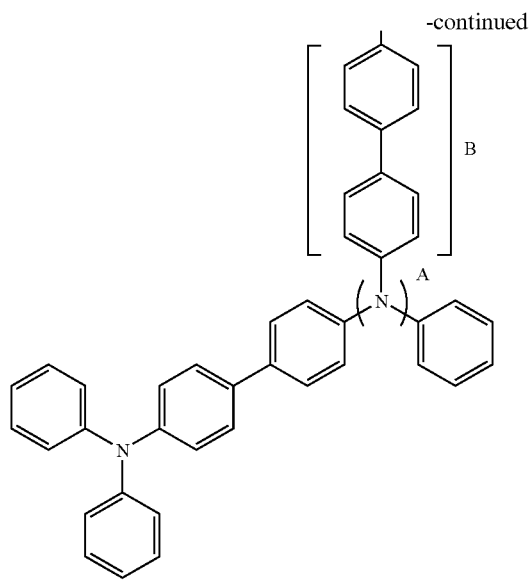

SUMMARY OF THE INVENTION

It is apparent from the foregoing that the development of new practical display devices (organic EL) with good lifetime needs not only high-performance materials but also sophisticated structure.

The conceivable materials that would meet requirements for organic EL are listed below.

(1) Electron transporting materials having a great electron mobility or a great hole mobility.

(2) Emitting materials having a sufficient mobility.

(3) Charge transporting materials optimized for individual color emitting materials.

(4) Materials having good heat resistance (or having a high glass transition point Tg).

(5) Non-crystallizable or hardly crystallizable materials.

(6) Materials capable of purification to a high degree.

Of the properties mentioned above, the high glass transition point (Tg) is important for improving the stability for heat. The organic EL is subject to thermal deactivation during light emission by excitons. Consequently, high heat resistance is important for storage and for driving.

One way to improve heat resistance is to introduce rigid skeletons into the molecule or to increase the molecular weight. However, the results are usually unfavorable to mobility. The present inventors found that the starburst amine skeleton represented by the formula (1) or the triphenylamine tetramer represented by the formula (2) has an electron density distribution which is localized on a specific nitrogen atom in the molecule.

The heat-resistant hole injection material or hole transporting material represented by the structural formula (1) or (2) has a large skeleton and contains many triphenylamine units. However, on account of the localized electron density distribution mentioned above, they increase the driving voltage and easily deteriorate when they are incorporated into devices.

It is an object of the present invention to provide a new display device which is comparable or superior to conventional ones in properties of operation at normal temperature and which also exhibits improved high-temperature performance and extended life, owing to the organic material having good heat resistance and high mobility.

The present invention is directed to a display device having a cathode, an anode, and a light emitting unit interposed between the cathode and the anode including at least an organic lightemitting layer, wherein the emitting unit contains the organic material represented by the formula (1) below.

Formula (1)

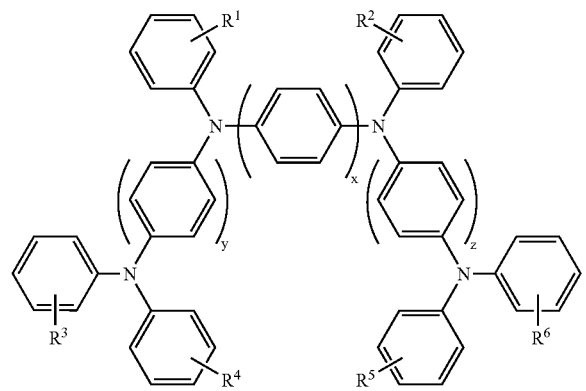

(where x denotes an integer of 4 to 6, y and z each denotes an integer of 1 to 6, and $R^1$ to $R^6$ each independently denotes a $C_{1-6}$ alkyl group or a $C_{5-6}$ cycloalkyl group.)

The organic material represented by the formula (1) may have typical structures represented by the structural formulas (3) to (5) below.

Structural formula
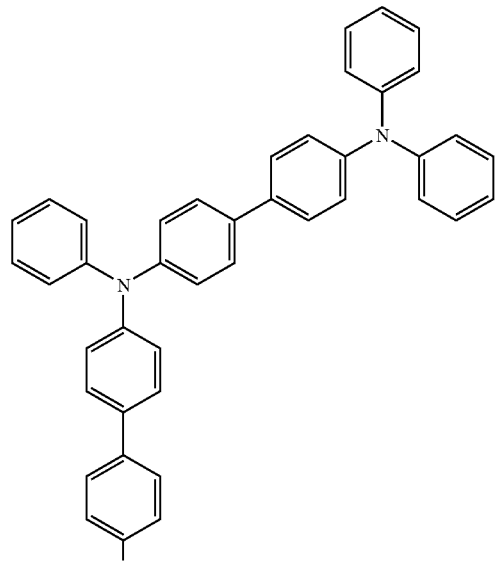
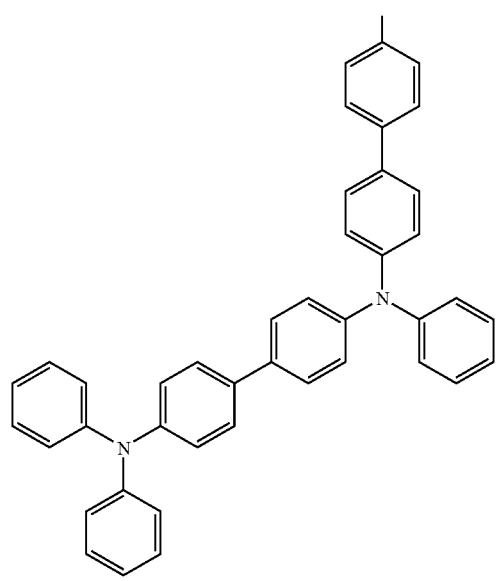
(3)
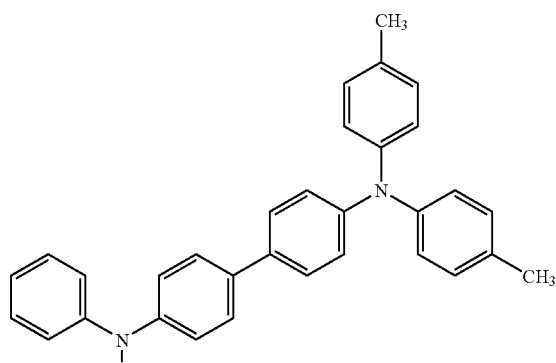

-continued
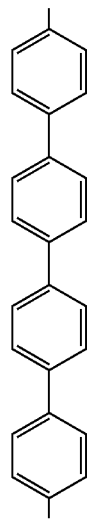
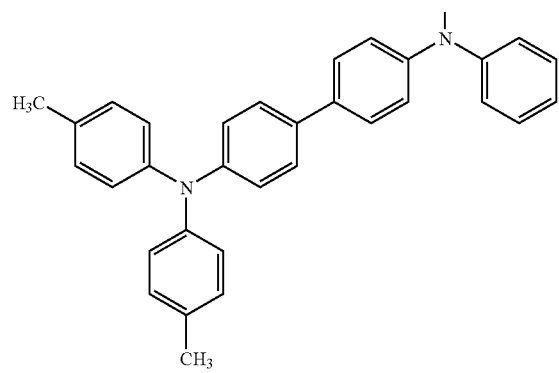
(4)
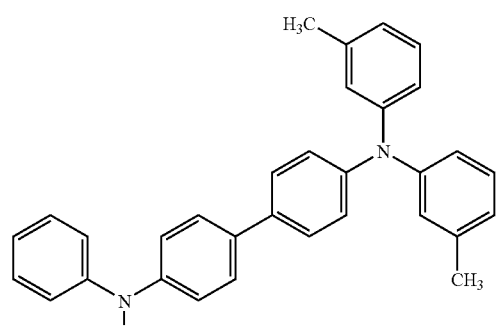

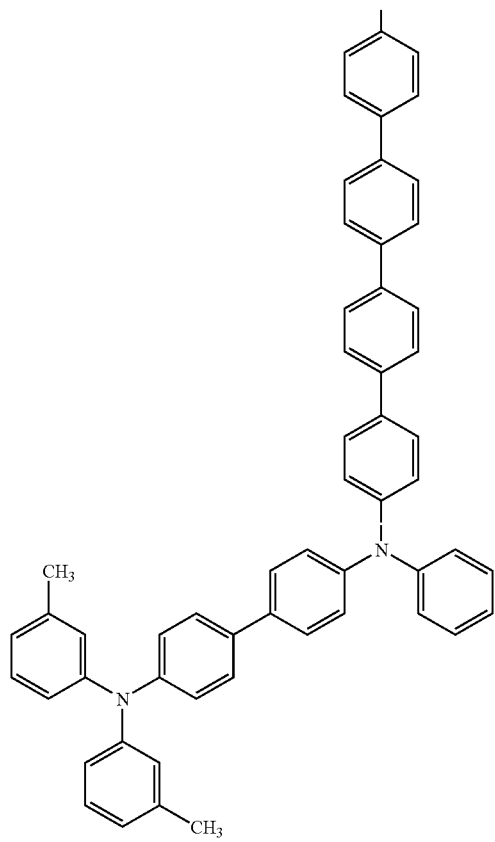

(5)

The material represented by the structural formula (2) is constructed such that two triphenylamine skeletons at terminals of the moiety (B) are not sufficiently twisted from each other, and the electron density is concentrated in the triphenylamine skeletons at two other terminals. Therefore, the moiety (A) in the structural formula (2) is inactive and the triphenylamine skeleton in the moiety (A) does not function effectively as the hole transporting unit.

By contrast, the organic material having the skeleton represented by the formula (1) is a triphenylamine tetramer and has good heat resistance. Moreover, the value of x in the formula (1) is no smaller than 4 and two triphenylamine skeletons at both terminals are sufficiently twisted from each other with a sufficient degree. The result is that the electron density is distributed equally in those two triphenylamine skeletons and the terminal triphenylamine skeleton. Consequently, the organic material represented by the formula (1) has a uniform electron density distribution in the four triphenylamine skeletons, all of which function as the hole transporting unit. The organic material mentioned above makes the display device to improve in hole transporting performance. Incidentally, it can be used to form a film by vapor deposition if the values of x, y, and z in the formula (1) are no larger than 6.

According to the present invention, the organic material represented by the formula (1) should preferably be used to form either the hole transporting layer or the hole injection layer and disposed in the emitting unit. In other words, the emitting unit should preferably have either the hole transporting layer or the hole injection layer made from the organic material represented by the formula (1) above.

As mentioned above, the display device according to the present invention is comparable or superior to conventional ones in properties, such as reduced driving voltage at normal temperature and extended life. This effect is attributable to the organic material which has good heat resistance (because it is a triphenylamine tetramer) and exhibits good hole transporting performance (because the electron density distribution is uniform in all the triphenylamine skeletons in the molecule).

BRIEF DESCRIPTION OF THE DRAWINGS

FIG. 6 is a sectional view of a conventional display device.

DESCRIPTION OF THE PREFERRED EMBODIMENTS

The display device according to each embodiment of the present invention will be described in more detail with reference to the accompanying drawings.

First Embodiment

Figure 1:
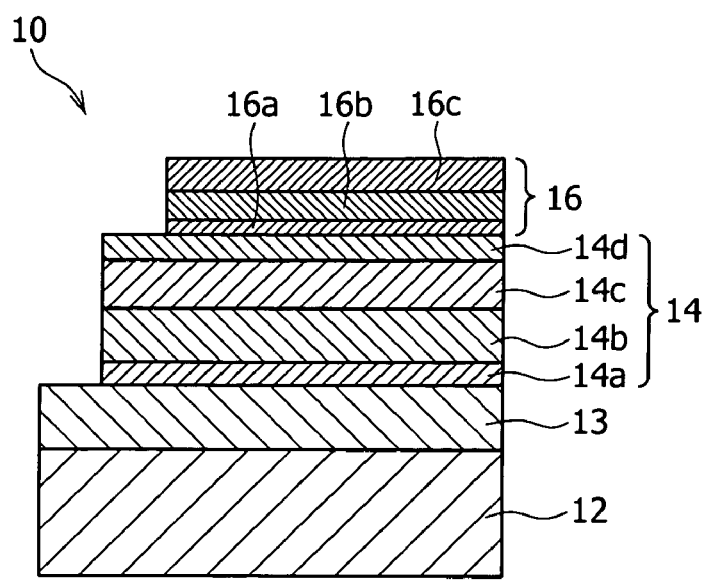
FIG. 1 is a sectional view showing the structure of the display device according to the first embodiment.

FIG. 1 is a sectional view showing the structure of the display device according to the first embodiment. The display device 10 includes a substrate 12, an anode 13, an emitting unit 14 with organic layers, and a cathode 16 which are placed one over another.

The following is concerned with a display device of top emitting type which radiates light through the cathode 16 (opposite to the substrate 12). The light radiates as the result of recombination of holes injected from the anode 13 and electrons injected from the cathode 16 in the emitting unit 14.

The display device 10 has a substrate 12 which may be selected from a transparent glass substrate, silicon substrate, or flexible filmy substrate. In the case where the display device 10 is formed into a display device of active matrix type, the substrate 12 may be a TFT substrate having TFTs for individual pixels.

The substrate 12 has an anode 13 (as the lower electrode), which is made of a material having a large work function in vacuum level for efficient hole injection. Examples of such a material include chromium (Cr), gold (Au), alloy of tin oxide ($SnO_2$) and antimony (Sb), alloy of zinc oxide (ZnO) and aluminum (Al), and oxides of these metals or alloys which are used alone or in combination with each other.

The display device 10 of top emitting type should have an anode 13 made of a high-reflecting material, so that it radiates light efficiently by interference and reflectance. Examples of such a material include Al and Ag. The anode of high-reflecting material layer may be coated with a layer of transparent electrode material (such as ITO) having a large work function, which increases the charge injection efficiency.

In the case where the display device 10 is used for a display device of active matrix type, the anode 13 is patterned for individual pixels having TFTs. On the anode 13 is formed an insulating film (not shown), which has openings through which the surface of the anode 13 for pixels is exposed.

The emitting unit 14 is composed of a hole injection layer 14a, a hole transporting layer 14b, an emitting layer 14c, and an electron transporting layer 14d, which are placed one over another upward from the anode 13. These layers are organic layers formed by vacuum deposition or other methods such as spin coating.

At least either the hole injection layer 14a or the hole transporting layer 14b is made from the organic material represented by the formula (1) above. The organic material may have the structure represented by the structural formulas (3) to (5) above. It may have other structures.

The organic material represented by the formula (1) may be mixed with the other organic material and the resulting mixture may be placed in the emitting unit. In other words, the emitting unit 14 may have a layer composed of a mixture of the organic material represented by the formula (1) and the other organic material. A preferred example of the other organic material is a triphenylamine dimer (typically α-NPD) excellent in hole transporting performance.

In the case where the hole injection layer 14a is made from the organic material represented by the formula (1), the hole transporting layer 14b may be made from the organic material such as triphenylamine dimer (typically α-NPD).

The emitting layer 14c may be a thin organic film containing a small amount of such an organic substance as perylene derivative, coumarin derivative, pyrans dye, and triphenylamine derivative. In this case, the emitting layer 14c may be formed by codeposition of a base material and an auxiliary material.

Each organic layer (such as the hole injection layer 14a and the hole transporting layer 14b) may be composed of more than one layer.

Each of the layers 14a to 14d may have an additional function; for example, the emitting layer 14c may function also as the electron transporting layer 14d, or the emitting layer 14c may function also as the hole transporting layer 14b. Moreover, each layer may have a laminate structure. For example, the emitting layer 14c may be a white light emitting element composed of a blue light emitting part, a green light emitting part, and a red light emitting part.

The cathode 16 is composed of two layers (16a and 16b) or three layers (16a, 16b, and 16c), which are placed one over another upward from the anode 13.

The first layer 16a is made from a highly transparent material having a small work function. Examples of such a material include lithium oxide and silicate ($Li_2O$ and $Li_2SiO_3$) and cesium oxide and carbonate ($Cs_2O$ and $Cs_2CO_3$) and a mixture of such oxides. The materials for the first layer 16a are not limited to those mentioned above. They include alkaline earth metals such as calcium (Ca) and barium (Ba), alkali metals such as lithium (Li) and cesium (Cs), and metals having a small work function such as indium (In), magnesium (Mg), and silver (Ag). They may be used as such or in the form of stable fluoride or oxide (as a simple substance or mixture) or in the form of stable alloy.

The second layer 16b is made from MgAg or Al. An MgAg thin film, which is translucent and reflective, is suitable for the cathode 16 of the top emitting element of cavity structure, which is designed such that the emitted light undergoes resonance between the anode 13 and the cathode 16. Thus, light reflection takes place (for cavity effect) between the interface of the second layer 16b and the interface of the anode 13.

The third layer 16c is made from a transparent lanthanoid oxide which protects the electrode from deterioration. The third layer functions also as a sealing electrode allowing the passage of emitted light.

The first to third layers (16a to 16c) may be formed by vacuum deposition, sputtering, or plasma CVD. In the case where the display device is used for the display device of active matrix type, the cathode 16 is formed on the entire surface of the substrate 12 so that it is used as a common electrode for individual pixels. The cathode 16 is isolated from the anode 13 by an insulating film (not shown) covering the periphery of the anode 13 and also by the laminated film of the emitting unit 14.

The cathode 16 mentioned above has a three-layer structure; however, it may be formed differently. That is it may be composed of the second layer 16b alone, or it may have an additional transparent layer of ITO between the first and the second layers 16a and 16b. The selection of layer structure depends on the structure of the desired device.

The display device 10 constructed as mentioned above has the hole injection layer 14a and the hole transporting layer 14, at least either of which is made from the organic material represented by the formula (1) above. Therefore, it exhibits improved hole transporting performance by the hole injection layer 14a and the hole transporting layer 14b. Being triphenylamine tetramer, the organic material has good heat resistance. Thus, the display device 10 is comparable or superior to conventional ones in performance (capability of being driven with low voltage at normal temperature) and extended life.

Second Embodiment

Figure 2:
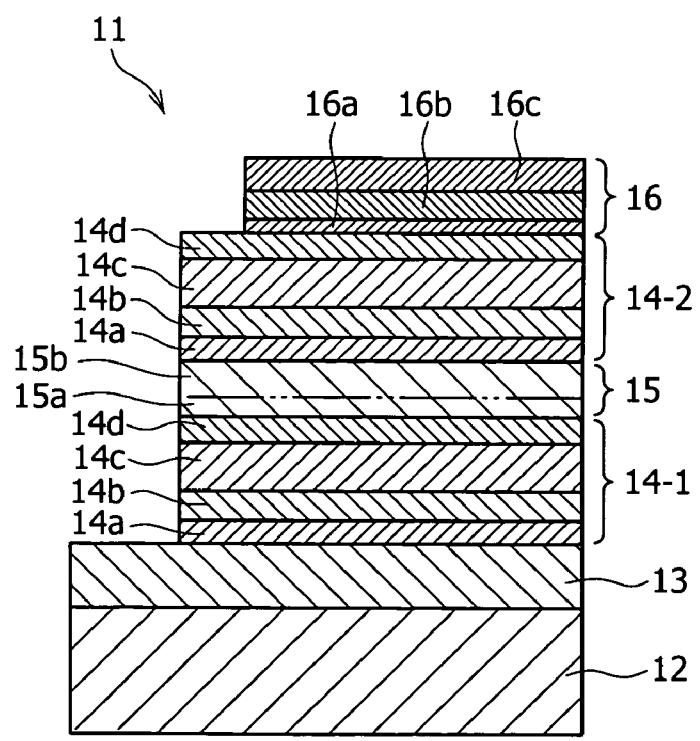
FIG. 2 is a sectional view showing the structure of the display device according to the second embodiment.

FIG. 2 is a sectional view showing the structure of the display device according to the second embodiment. The same constituents as those in the display device shown in FIG. 1 are given the same symbols.

The display device 11 shown in FIG. 2 is a stacked type device with a plurality of emitting units stacked. It includes a substrate 12, an anode 13, a plurality of emitting units 14-1, 14-2, . . . (two in this case), a charge generating layer 15 held between the emitting units, and a cathode 16.

In the display device 11, the substrate 12, the anode 13, and the cathode 16 are identical with those in the display device 10 according to the first embodiment. Each of the emitting units 14-1 and 14-2 is identical with the emitting unit 14 in the display device 10 according to the first embodiment. That is, it includes the hole injection layer 14a and the hole transporting layer 14b which are made from the organic material represented by the formula (1) above. The emitting units 14-1 and 14-2 may be of the same structure or different structure. For example, the emitting unit 14-1 may be made from an organic material for an orange light emitting element and the emitting unit 14-2 may be made from an organic material for a blue light emitting element. The resulting display device will emit white light.

The charge generating layer 15, which is placed between the emitting unit 14-1 and the emitting unit 14-2, should preferably contain at least either alkali metal oxide or alkaline earth metal oxide.

The charge generating layer 15 should preferably be made up of an interfacing layer 15a and an intrinsic charge generating layer 15b, which are attacked upward from the anode 13. Incidentally, the interfacing layer 15a substantially functions as a cathode for the emitting unit 14-1. Therefore, this interfacing layer 15a will be referred to as an intermediate cathode layer 15a hereinafter. This intermediate cathode layer 15a should be made from at least either alkali metal oxide or alkaline earth metal oxide.

The intrinsic charge generating layer 15b, which is in contact with the intermediate cathode layer 15a, may be made from $V_2O_5$, which is used for the charge generating layer mentioned in Japanese Patent Laid-open No. 2003-45676 and No. 2003-272860, or it may be made from an organic compound mentioned below.

The intermediate cathode layer 15a is made from any one or more species selected from alkali metal (complex) oxides or alkaline earth metal (complex) oxides, such as metaborate, tetraborate, germanate, molybdenate, niobate, silicate, tantalate, titanate, vanadate, tungstate, zirconate, carbonate, oxalate, chromite, chromate, bichromate, ferrite, selenite, selenate, stannate, tellurite, tellurate, and bismathate.

Of these complex oxides, $Li_2SiO_3$ is desirable for the intermediate cathode layer 15a.

Other organic compound than $V_2O_5$ for the intrinsic charge generating layer 15b is represented by the formula (2) below.

Formula (2)

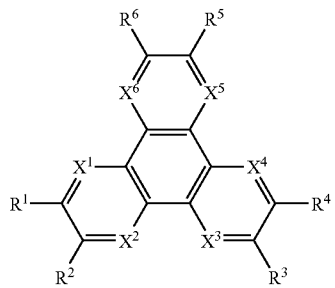

(where $R^1$ to $R^6$ independently denote a substituent group selected from hydrogen, halogen, hydroxyl group, amino group, arylamino group, substituted or unsubstituted carbonyl group with a carbon number no larger than 20, substituted or unsubstituted carbonyl ester group with a carbon number no larger than 20, substituted or unsubstituted alkyl group with a carbon number no larger than 20, substituted or unsubstituted alkenyl group with a carbon number no larger than 20, substituted or unsubstituted alkoxyl group with a carbon number no larger than 20, substituted or unsubstituted aryl group with a carbon number no larger than 30, substituted or unsubstituted heterocyclic group with a carbon number no larger than 30, nitrile group, nitro group, and cyan group. Of these groups ($R^1$ to $R^6$), adjacent ones ($R^m$, where m=1 to 6) may be joined together through a cyclic structure. $X^1$ to $X^6$ independently denote a carbon or nitrogen atom.)

The organic compound represented by the formula (2) is exemplified by those represented by the structural formulas (6)-1 to (6)-66 shown in Tables 1 to 7 below. In these structural formulas, [Me] denotes methyl ($CH_3$) and [Et] denotes ethyl ($C_2H_5$). The structural formulas (6)-61 to (6)-66 include those of the organic compounds represented by the formula (2) in which adjacent groups of $R^1$ to $R^6$ are joined together through a cyclic structure.

TABLE 1

Structural formula (6)-1

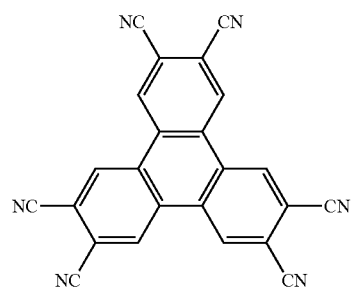

TABLE 1-continued
Structural formula (6)-2
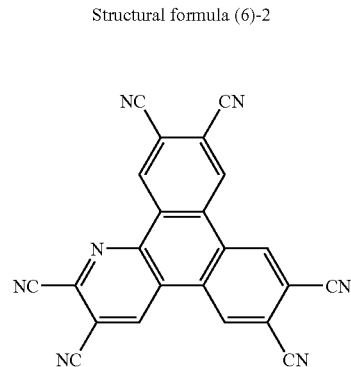
Structural formula (6)-3
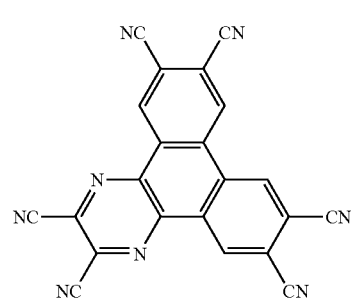
Structural formula (6)-4
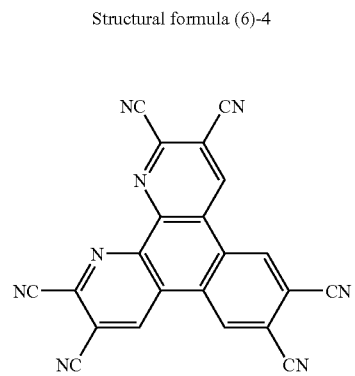
Structural formula (6)-5
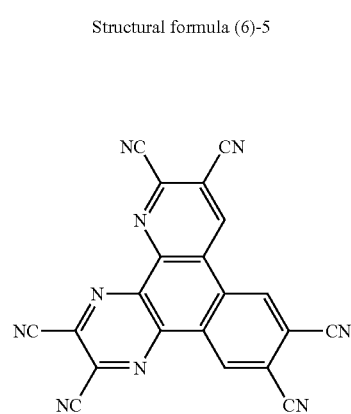
TABLE 1-continued
Structural formula (6)-6
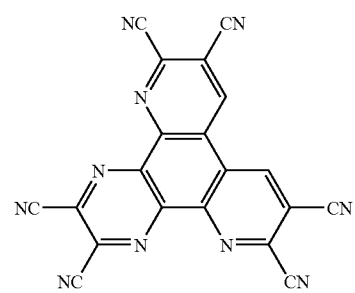
Structural formula (6)-7
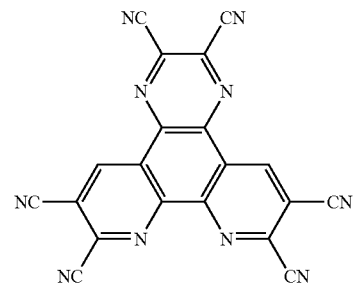
Structural formula (6)-8
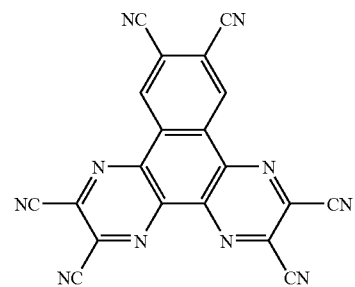
Structural formula (6)-9
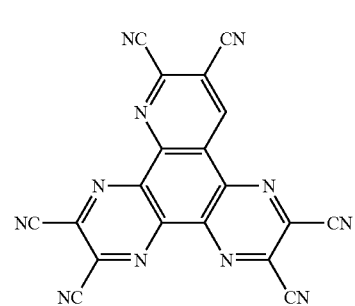

TABLE 1-continued

Structural formula (6)-10

TABLE 2

Structural formula (6)-11

Structural formula (6)-12

Structural formula (6)-13

TABLE 2-continued

Structural formula (6)-14

Structural formula (6)-15

Structural formula (6)-16

Structural formula (6)-17

TABLE 2-continued
Structural formula (6)-18
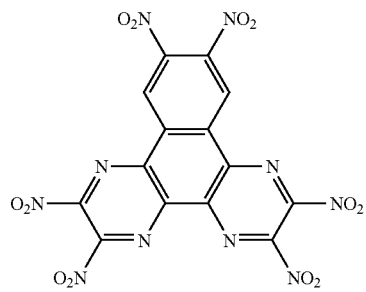
Structural formula (6)-19
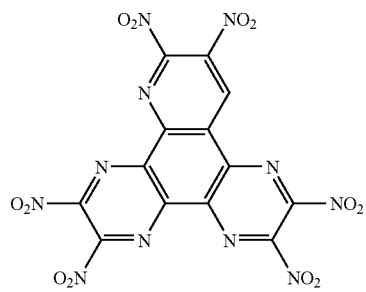
Structural formula (6)-20
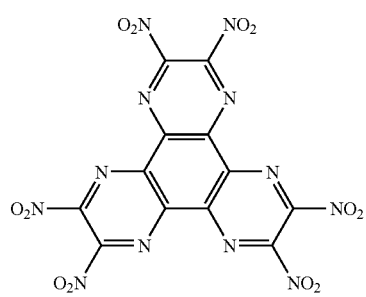
TABLE 3
Structural formula (6)-21
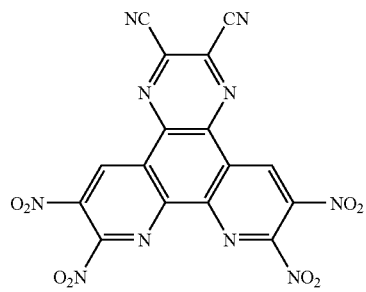
TABLE 3-continued
Structural formula (6)-22
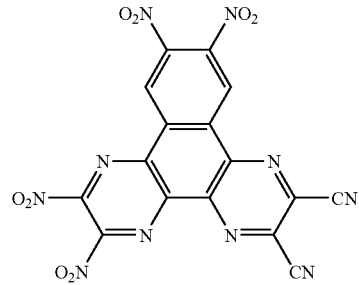
Structural formula (6)-23
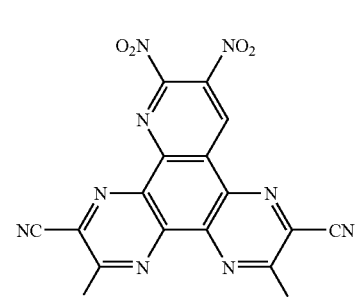
Structural formula (6)-24
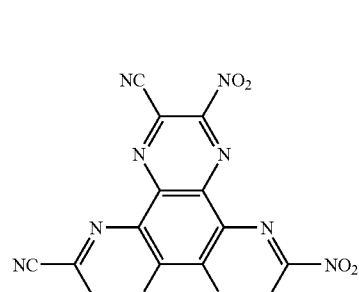
Structural formula (6)-25
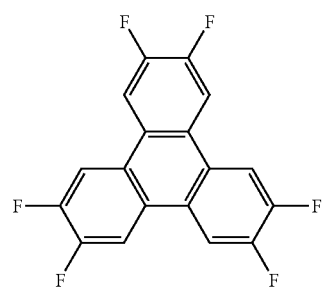

TABLE 3-continued
Structural formula (6)-26
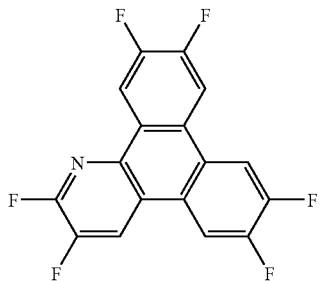
Structural formula (6)-27
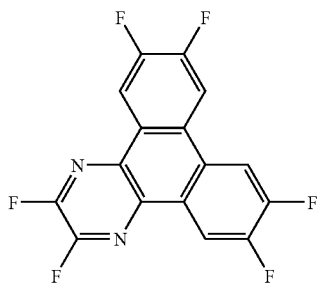
Structural formula (6)-28
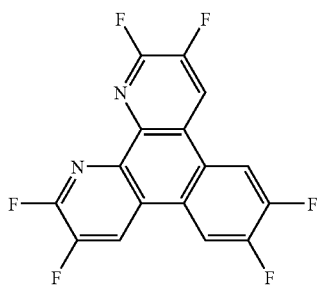
Structural formula (6)-29
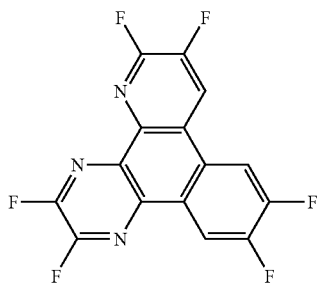
TABLE 3-continued
Structural formula (6)-30
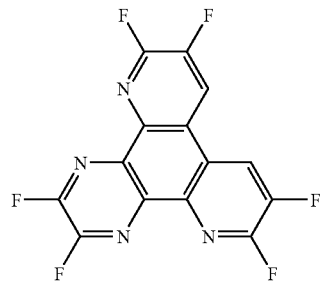
TABLE 4
Structural formula (6)-31
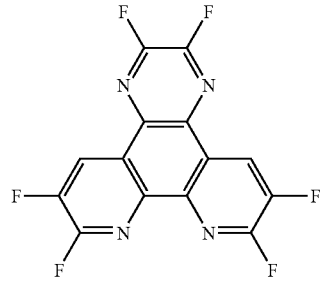
Structural formula (6)-32
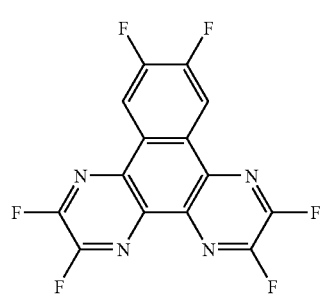
Structural formula (6)-33
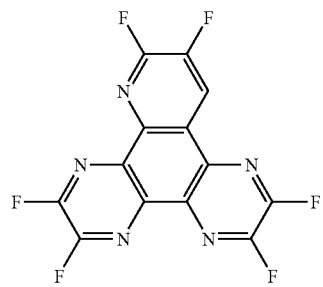

TABLE 4-continued
Structural formula (6)-34
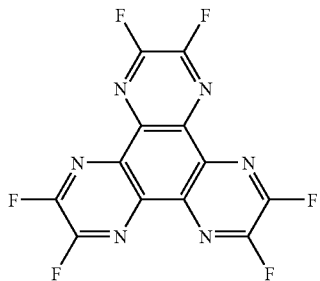
Structural formula (6)-35
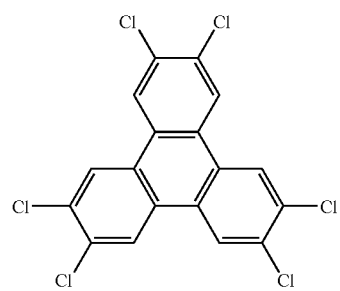
Structural formula (6)-36
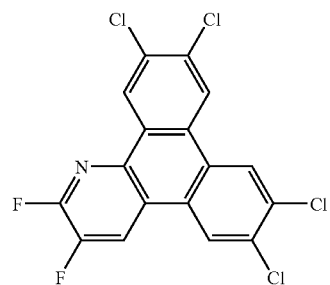
Structural formula (6)-37
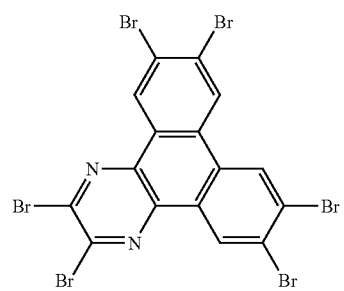
TABLE 4-continued
Structural formula (6)-38
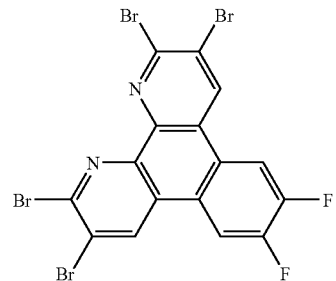
Structural formula (6)-39
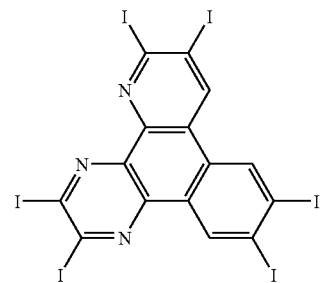
Structural formula (6)-40
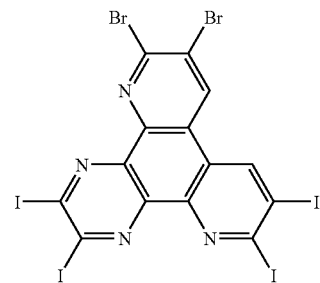
TABLE 5
Structural formula (6)-41
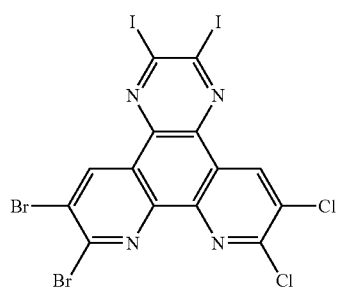

TABLE 5-continued
Structural formula (6)-42
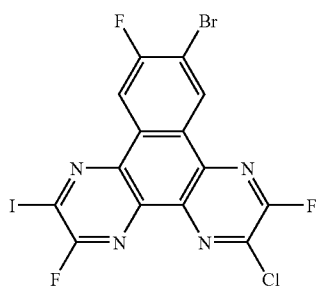
Structural formula (6)-43
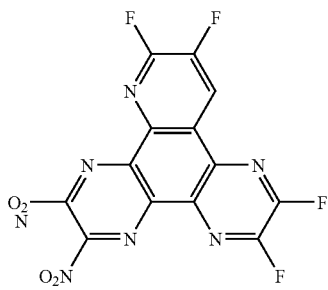
Structural formula (6)-44
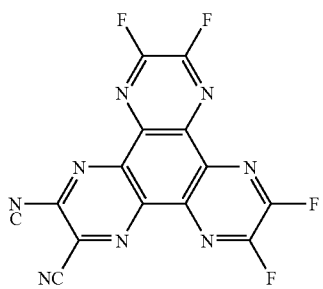
Structural formula (6)-45
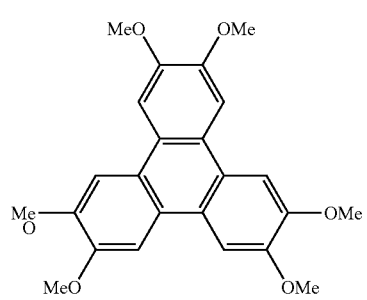
TABLE 5-continued
Structural formula (6)-46
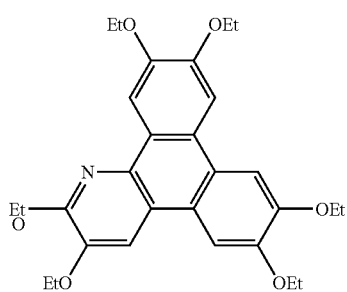
Structural formula (6)-47
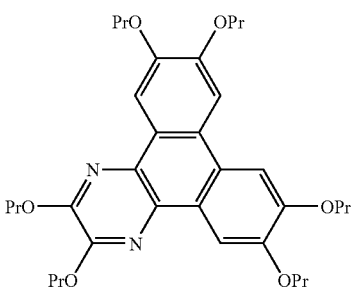
Structural formula (6)-48
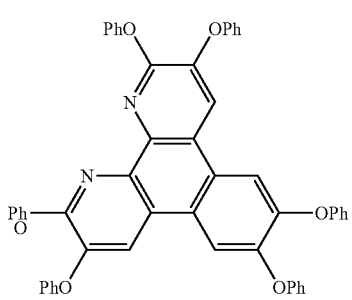

TABLE 5-continued
Structural formula (6)-49
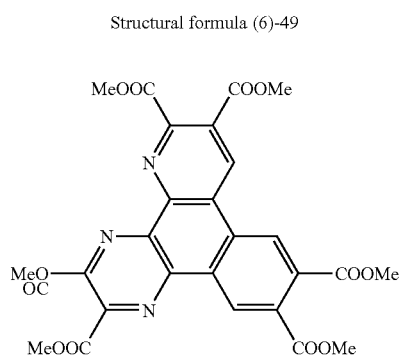
TABLE 5-continued
Structural formula (6)-50
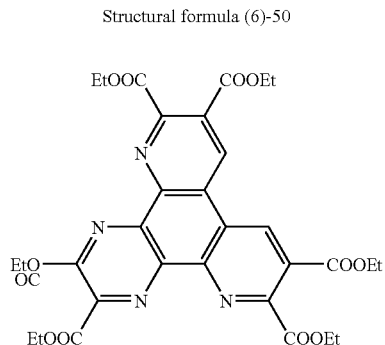
TABLE 6
Structural formula (6)-51
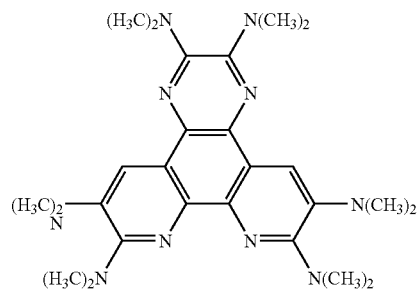
Structural formula (6)-52
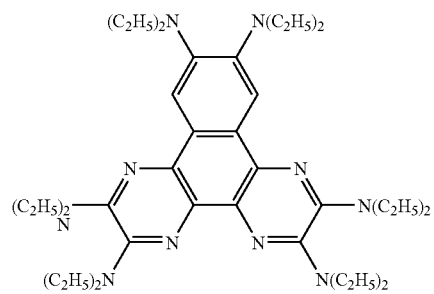
Structural formula (6)-53
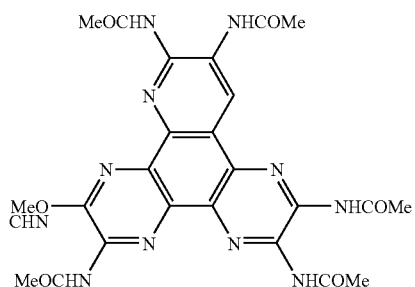

TABLE 6-continued
Structural formula (6)-54
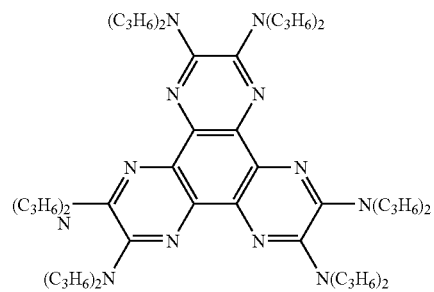
Structural formula (6)-55
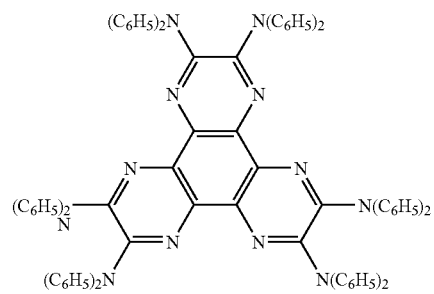
Structural formula (6)-56
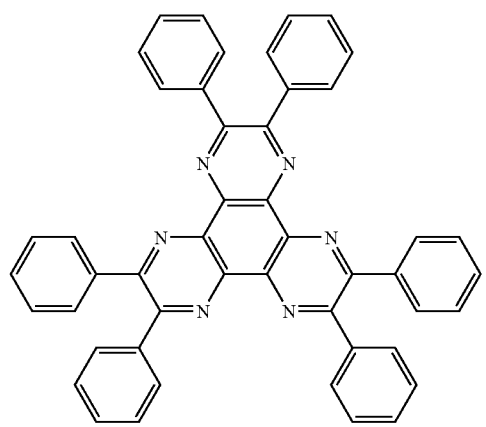

TABLE 6-continued
Structural formula (6)-57
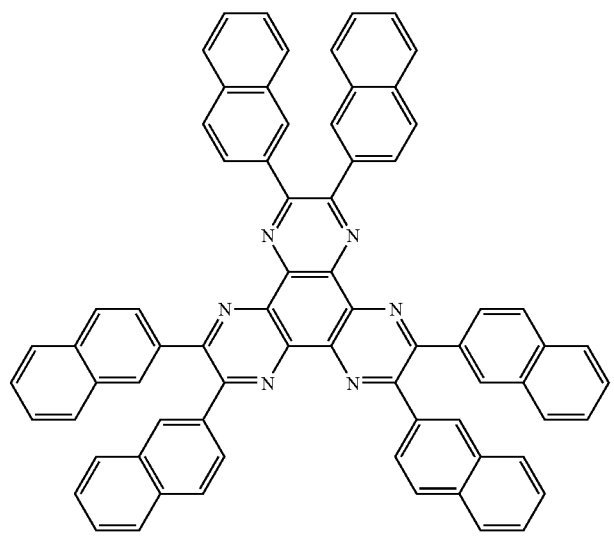
Structural formula (6)-58
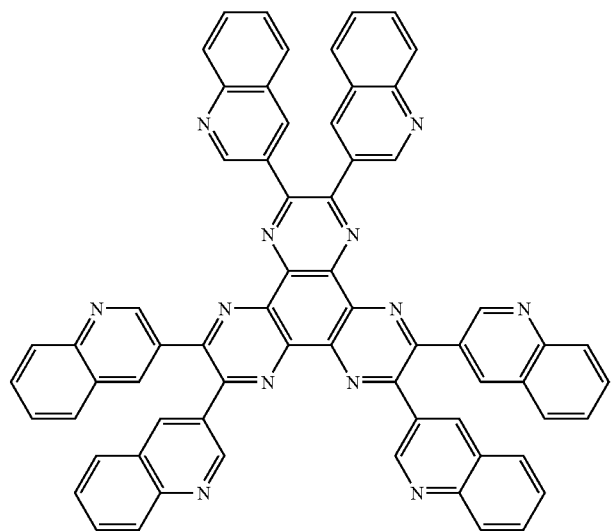

TABLE 6-continued
Structural formula (6)-59
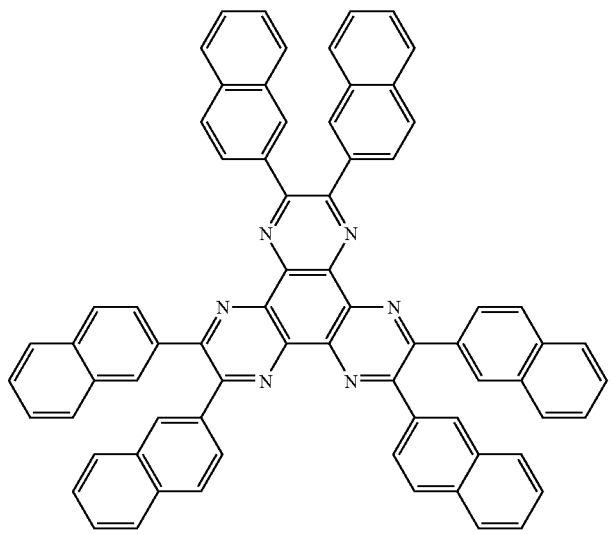
Structural formula (6)-60
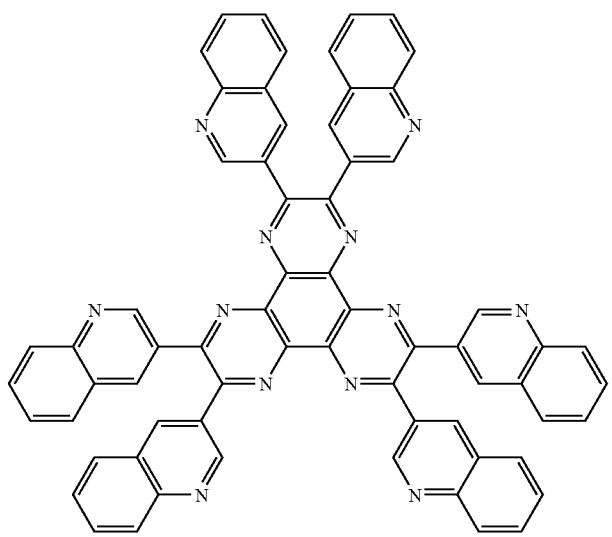
TABLE 7
Structural formula (6)-60
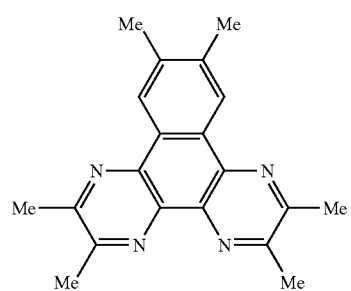
TABLE 7-continued
Structural formula (6)-60
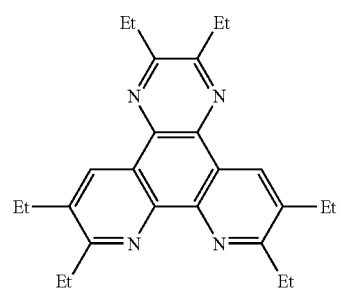

TABLE 7-continued

Structural formula (6)-60

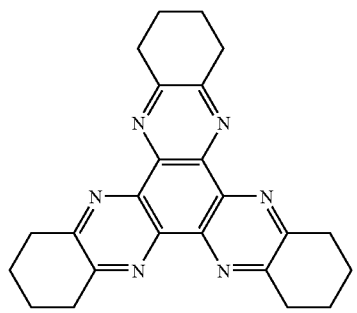

Structural formula (6)-60

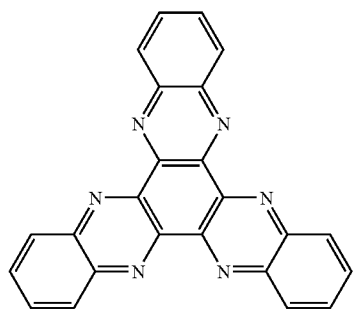

Structural formula (6)-60

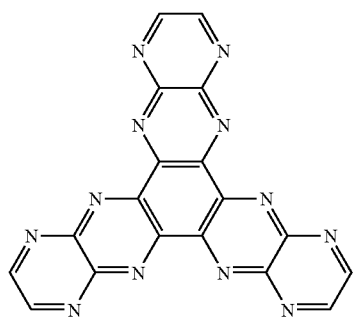

Structural formula (6)-60

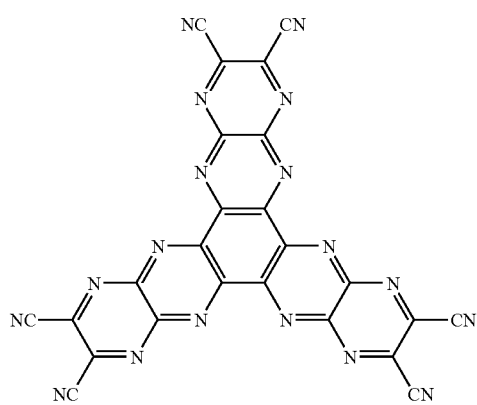

It is not always necessary that the intermediate cathode layer 15a is distinctly separate from the intrinsic charge generating layer 15b. The intermediate cathode layer 15a may contain any material constituting the intrinsic charge generating layer 15b, or vice versa.

The charge generating layer 15 may additionally have an intermediate anode layer (not shown) on the intrinsic charge generating layer 15b. This intermediate anode layer is made from an organic material having the phthalocyanine skeleton, such as copper phthalocyanine (CuPc).

In the case where the intrinsic charge generating layer 15b of the charge generating layer 15 is made from the organic compound represented by the formula (2) above it may function also as the hole injection layer 14a. In this case, the hole injection layer 14a is not necessarily provided in the emitting unit 14-2 (closer to the cathode 16).

As mentioned above, the display device 11 according to the second embodiment has the emitting units 14-1 and 14-2 in which at least either the hole injection layer 14a or the hole transporting layer 14b is made from the organic material represented by the formula (1) above. This helps improvement of the hole transporting performance of the hole injection layer 14a and the hole transporting layer 14b in the emitting units 14-1 and 14-2. In addition, the organic material is a triphenylamine tetramer which has good heat resistance, and the heat resistance of the stacked type display device 11 is improved. Like the display device 10 according to the first embodiment, the display device 11 is also comparable or superior to conventional ones in performance (capability of being driven with low voltage at normal temperature) and extended life.

The display device 11 according to the second embodiment has the charge generating layer 15, whose intermediate cathode layer 15a contains at least either alkali metal oxides or alkaline earth metal oxides. This structure achieves efficient electron injection from the charge generating layer 15 to the emitting unit 14-1 (near the anode 13). Being made of alkali metal oxide or alkaline earth metal oxide, which is thermally stable, the intermediate cathode layer 15a is thermally stable and the charge generating layer 15 containing it is also thermally stable.

The intermediate anode layer (not shown) of an organic material having the phthalocyanine skeleton, which is formed on the side of the charge generating layer 15 which is close to the cathode 16, improves the efficiency of hole injection from the charge generating layer 15 to the emitting unit 14-2 arranged on that side of the charge generating layer 15 which is close to the cathode 16.

According to the second embodiment, the stacked type display device 11 with the emitting units 14-1 and 14-2 consisting of organic layers has improved luminance as well as improved environment resistance leading to extended life (hence improved long-term reliability). In addition, the charge generating layer 15 capable of efficient charge injection is made from a stable material without the necessity of considering the stoichiometric ratio. This facilitates production of the stacked type display device 11 with improved long-term reliability.

Even in the case where the intrinsic charge generating layer 15b of the charge generating layer 15 is made from the organic compound represented by the formula (2), it achieves a high charge injecting efficiency equal to that of conventional ones using $V_2O_5$. In this case, the intrinsic charge generating layer 15b functions also as the hole injection layer and the hole injection layer 14a is not necessarily provided in the emitting unit 14-2 which is closer to the cathode 16 than the charge generating layer 15. This simplifies the layer structure.

Third Embodiment

Figure 3:
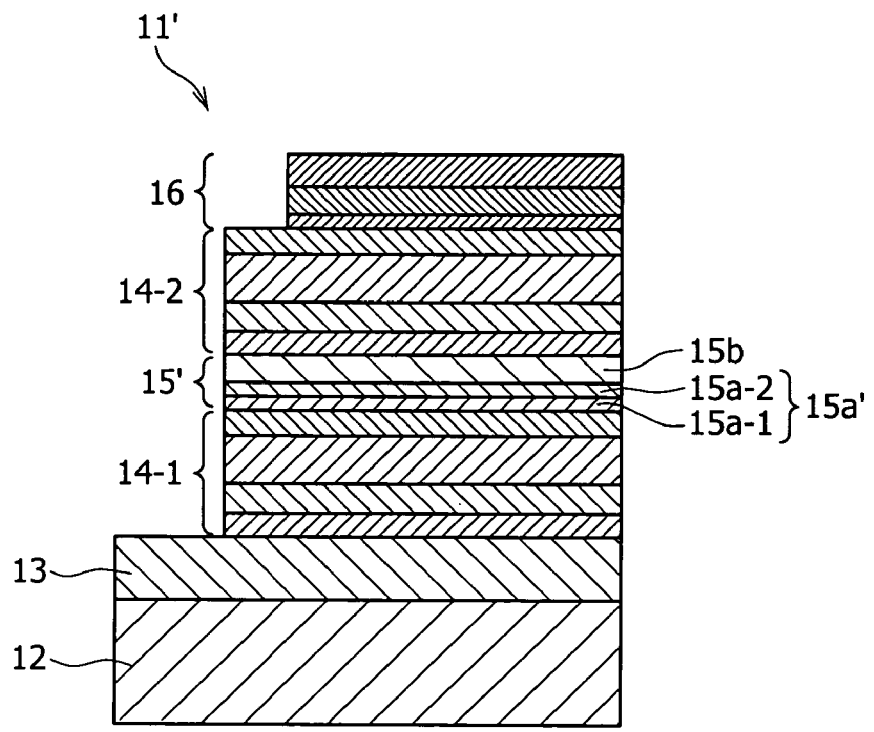
FIG. 3 is a sectional view showing the structure of the display device according to the third embodiment.

FIG. 3 is a sectional view showing the structure of the display device according to the third embodiment. The display device 11' shown in FIG. 3 is identical with the display device 11 shown in FIG. 2 except for the structure of the charge generating layer 15', which will be explained in more detail below.

In the display device 11' according to the third embodiment, the charge generating layer 15' includes the interface layer 15*a'* and the intrinsic charge generating layer 15*b* which are stacked upward. The interface layer 15*a'* functions as the cathode for emitting unit 14-1 in contact with the anode 13, as in the case of the second embodiment. Therefore, it will be referred to as the intermediate cathode layer 15*a'* hereinafter.

The charge generating layer 15' is characterized in that the intermediate cathode layer 15*a'* contains at least either alkali metal fluoride or alkaline earth metal fluoride. Particularly, the intermediate cathode layer 15*a'* should preferably include the fluoride layer 15*a*-1 and the conductive material layer 15*a*-2 which are arranged upward, both containing at least either alkali metal fluoride or alkaline earth metal fluoride.

The alkali metal fluoride and alkaline earth metal fluoride for the fluoride layer 15*a*-1 are exemplified by lithium fluoride (LiF), cesium fluoride (CsF), and calcium fluoride (CaF$_2$).

The material for the conductive material layer 15*a*-2 should contain at least one of magnesium (Mg), silver (Ag), and aluminum (Al), in the form of simple substance (e.g., Al) or alloy (e.g., MgAg).

The intrinsic charge generating layer 15*b*, which is in contact with the intermediate cathode layer 15*a'*, may be made from V$_2$O$_5$, which is used for the charge generating layer mentioned in Japanese Patent Laid-open No. 2003-45676 and No. 2003-272860, or it may be made from an organic compound represented by the formula (2). In the case where the intrinsic charge generating layer 15*b* is made from the organic compound represented by the formula (2), it may function also as the hole injection layer 14*a*. In this case, the hole injection layer 14*a* is not necessarily provided in the emitting unit 14-2 (closer to the cathode 16). The charge generating layer 15' may additionally have an intermediate anode layer (not shown) on the intrinsic charge generating layer 15*b*. This intermediate anode layer is made from an organic material having the phthalocyanine skeleton, such as copper phthalocyanine (CuPc). This structure is identical with that in the second embodiment.

The display device 11' according to the third embodiment also has the emitting units 14-1 and 14-2 in which at least either the hole injection layer 14*a* or the hole transporting layer 14*b* is made from the organic material represented by the formula (1). Therefore, like the display device 11 according to the second embodiment, the display device 11' is also comparable or superior to conventional ones in performance (capability of being driven with low voltage at normal temperature) and extended life.

The display device 11' according to the third embodiment has the charge generating layer 15', whose intermediate cathode layer 15*a'* contains at least either alkali metal fluoride or alkaline earth metal fluoride. This structure achieves efficient electron injection from the charge generating layer 15' to the emitting unit 14-1 (near the anode 13). Being made of alkali metal fluoride or alkaline earth metal fluoride, which is thermally stable, the intermediate cathode layer 15*a'* is thermally stable and the charge generating layer 15' containing it is also thermally stable.

In the case where the intermediate cathode layer 15*a'* includes the fluoride layer 15*a*-1 containing at least either alkali metal fluoride or alkaline earth metal fluoride and the conductive material layer 15*a*-2 containing MgAg (which are placed on top of the other), the intermediate cathode layer 15*a'* improves the efficiency of electron injection into the emitting unit 14-1 (near the anode 13).

The charge generating layer 15', which optionally has an intermediate anode layer (not shown) near the cathode 16, improves the efficiency of hole injection from the charge generating layer 15' into the emitting unit 14-2 near the cathode 16.

According to the third embodiment, the stacked type display device 11' with the emitting units 14-1 and 14-2 consisting of organic layers has improved long-term reliability, as in the case of the second embodiment. In addition, the stacked type display device 11' with improved long-term reliability can be produced easily.

Even in the case where the intrinsic charge generating layer 15*b* of the charge generating layer 15' is made from the organic compound represented by the formula (2), it achieves a high charge injecting efficiency equal to that of conventional ones using V$_2$O$_5$. This simplifies the layer structure, as in the case of the second embodiment.

Fourth Embodiment

Figure 4:
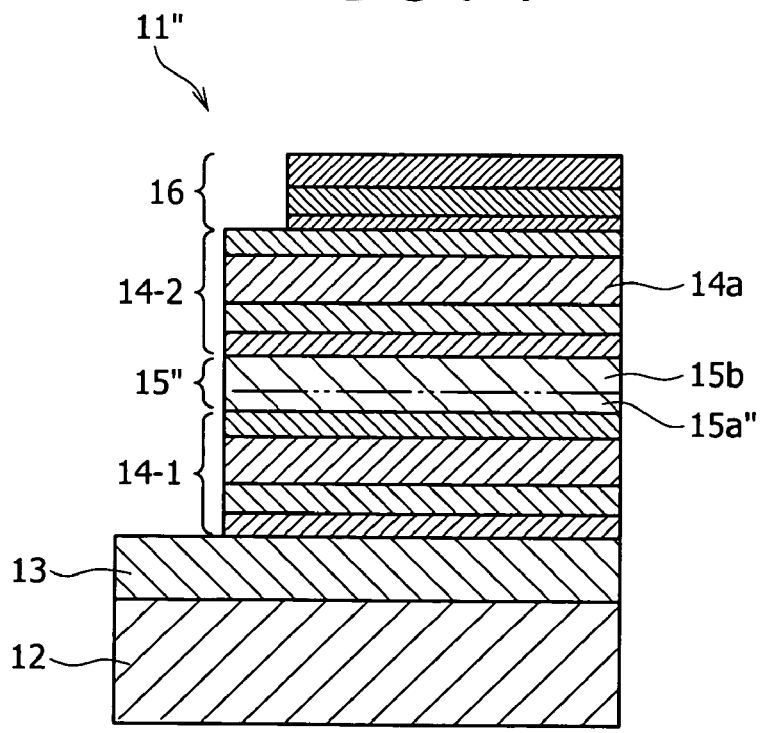
FIG. 4 is a sectional view showing the structure of the display device according to the fourth embodiment.

FIG. 4 is a sectional view showing the structure of the display device according to the fourth embodiment. The display device 11" shown in FIG. 4 is identical with the display device 11 shown in FIG. 2 except for the structure of the charge generating layer 15", which will be explained in more detail below.

Referring to the display device 11" according to the fourth embodiment, the charge generating layer 15" includes the mixture layer 15*a"* and the intrinsic charge generating layer 15*b*. The mixture layer 15*a"* functions as the cathode for emitting unit 14-1 in contact with the anode 13. Therefore, it will be referred to as the intermediate cathode layer 15*a"* hereinafter.

The charge generating layer 15" is characterized in that the intermediate cathode layer (or mixture layer) 15*a"* contains a mixture of at least either alkali metal or alkaline earth metal and an organic material. Examples of the alkali metal and alkaline earth metal include lithium (Li), cesium (Cs), sodium (Na), potassium (K), rubidium (Rb), beryllium (Be), magnesium (Mg), calcium (Ca), strontium (Sr), and barium (Ba). The organic material for the intermediate cathode layer (or mixture layer) 15*a"* should preferably be Alq$_3$ or ADN which has the electron transporting capability.

The intrinsic charge generating layer 15*b* is in contact with the intermediate cathode layer (mixture layer) 15*a"*, and it is made from the organic compound represented by the formula (2).

Incidentally, the intermediate cathode layer 15*a"* may be a laminate layer composed of a fluoride layer (not shown), which is made from at least either alkali metal fluoride or alkaline earth metal fluoride, and the above-mentioned mixture layer.

According to the fourth embodiment, the intrinsic charge generating layer 15*b* is made from the organic compound represented by the formula (2); therefore, it may function also as the hole injection layer 14*a*. In this case, the hole injection layer 14*a* is not necessarily provided in the emitting unit 14-2

(closer to the cathode 16). The charge generating layer 15" may additionally have an intermediate anode layer (not shown) on the intrinsic charge generating layer 15b. This intermediate anode layer is made from an organic material having the phthalocyanine skeleton, such as copper phthalocyanine (CuPc). This structure is identical with that in the second embodiment.

The display device 11" according to the fourth embodiment also has the emitting units 14-1 and 14-2 in which at least either the hole injection layer 14a or the hole transporting layer 14b is made from the organic material represented by the formula (1). Therefore, like the display device 11 according to the second embodiment, the display device 11" is also comparable or superior to conventional ones in performance (capability of being driven with low voltage at normal temperature) and extended life.

The stacked type display device 11" according to the fourth embodiment has the charge generating layer 15", which is composed of the mixture layer 15a" made from at least either alkali metal or alkaline earth metal and an organic material, and which is held between the emitting units 14a-1 and 14a-2. This structure contributes to highly efficient light emission. Moreover, the charge generating layer 15", which is made of thermally stable materials, is stable.

According to the fourth embodiment, the stacked type display device 11" with the emitting units 14-1 and 14-2 consisting of organic layers has improved long-term reliability, as in the case of the second and third embodiments. In addition, the stacked type display device 11 with improved long-term reliability can be produced easily, and the intrinsic charge generating layer 15b made from the organic compound represented by the formula (2) above simplifies the layer structure.

The display devices of the present invention, which have been explained in the foregoing embodiments, may be applied not only to display devices of active matrix type with a TFT substrate but also to display devices of passive type. They will produce the same effect (improved long-term reliability) in both cases.

The embodiments mentioned above are concerned with the display device of "top emitting type" which is designed such that light radiates through the cathode 16 opposite to the substrate. However, the present invention may also be applied to the display device of "transmission type" which is designed such that light radiates through the substrate 12 made from a transparent material. In the laminate structure explained above with reference to FIGS. 1 to 4, the anode 13 on the substrate 12 may be made from a transparent electrode material, such as ITO, which has a large work function. In this case, light radiates through both the substrate and its opposite side. If the cathode 16 is made from a reflecting material, light radiates only through the substrate 12. In this case, the cathode 16 may be coated with a sealing electrode of AuGe, Au, or Pt.

The laminate structure explained above with reference to FIGS. 1 to 4 may be reversed; that is, the layers are arranged on a transparent substrate 12 in the opposite order so that the anode 13 is the top electrode. In this way it is possible to construct a display device of "transmission type" for light radiating through the substrate 12. In this case, too, the display device permits light to radiate through the substrate 12 and its opposite side if the anode (top electrode) 13 is replaced by a transparent electrode.

EXAMPLES

The invention will be described with reference to the following examples and comparative examples which demonstrate the procedure for production of the display devices and which also show the results of their evaluation.

Examples 1 to 3

Samples of the display device 10, which is constructed as explained above with reference to FIG. 1, were prepared in the following manner. Each of them employs the material shown in Table 8 below for the hole transporting layer 14b in the emitting unit 14.

TABLE 8

|  | Emitting unit | | | | Relative luminance (initial) to comparative example 1 |
| --- | --- | --- | --- | --- | --- |
|  | Hole injection layer 14a | Hole transporting layer 14b | Emitting layer 14c | Electron transporting layer 14d | |
| Example 1 | HI-406 | Structural formula (3) | ADN | Alq3 | 1 |
| Example 2 | HI-406 | Structural formula (4) | ADN | Alq3 | 0.96 |
| Example 3 | HI-406 | Structural formula (5) | ADN | Alq3 | 0.95 |
| Comparative Example 1 | HI-406 | HT-320 | ADN | Alq3 | 1 |
| Comparative Example 2 | HI-406 | α-NPD | ADN | Alq3 | 0.8 |

A 30 mm square glass substrate 12 was coated with an Ag alloy film (about 100 nm thick) as the anode 13. The anode 13 was covered with an insulating film of $SiO_2$ (not shown) by vapor deposition excluding 2 mm square of emitting region. Thus a cell for an organic electroluminescence element is obtained.

The hole injection layer 14a (10 nm thick) constituting the first emitting unit 14-1 was formed by vacuum deposition (at a rate of 0.2 to 0.4 nm/s) from HI-406, a product from Idemitsu Kosan Co., Ltd.
The hole transporting layer 14b (10 nm thick) was formed by vacuum deposition (at a rate of 0.1 nm/s) from one of the organic materials represented by the structural formulas (3) to (5) below.
Structural formula
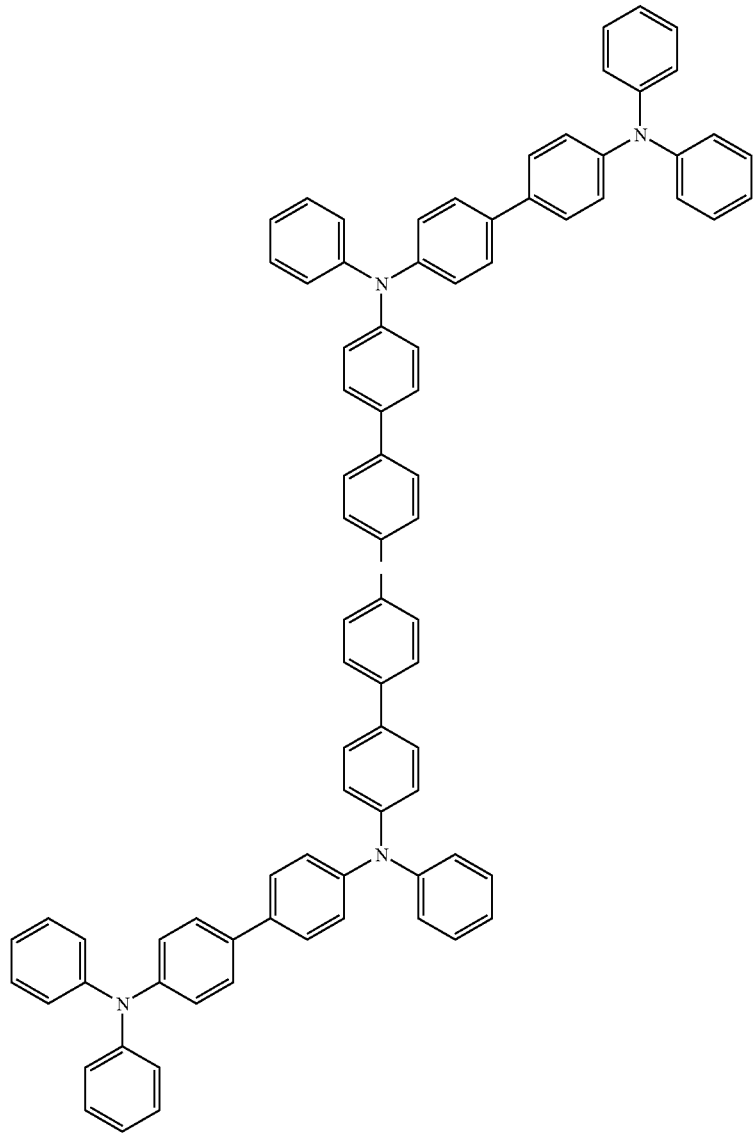
(3)
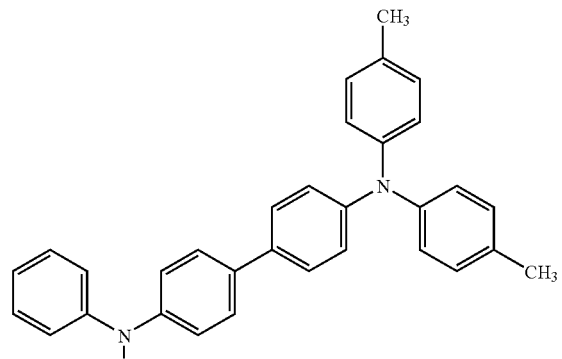

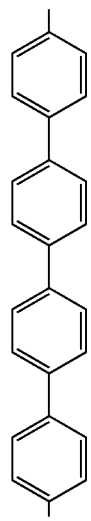
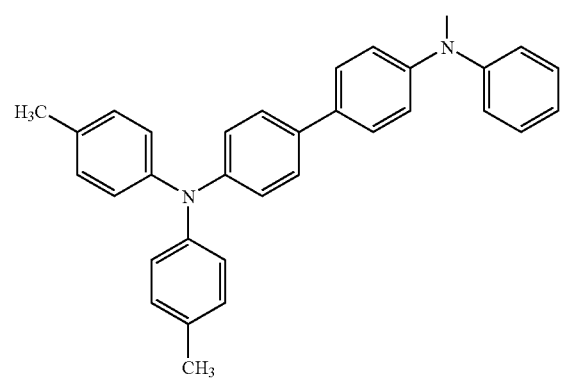
(4)
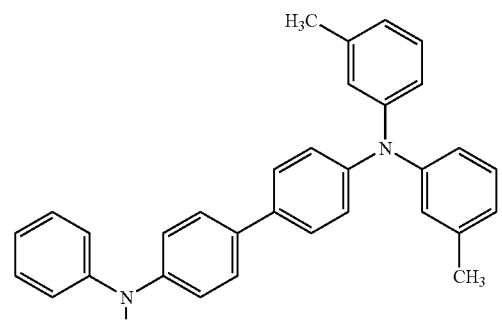

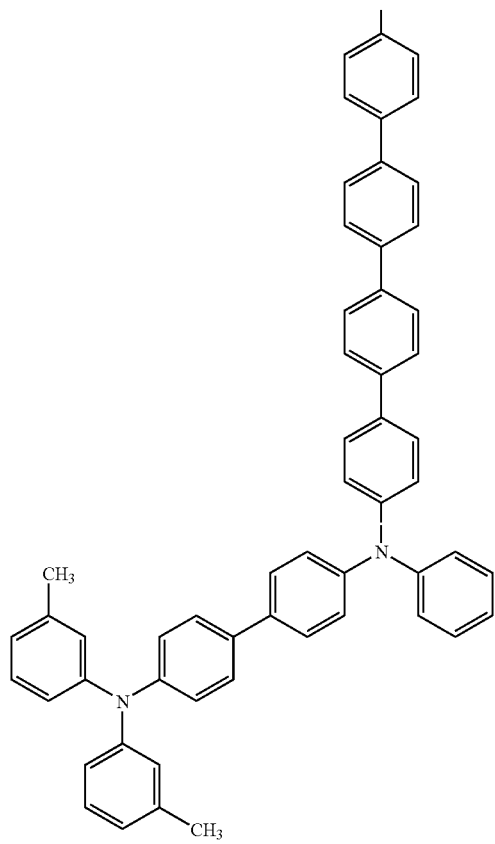

(5)

As the emitting layer 14c (32 nm thick), ADN represented by the structural formula (7) as host and BD-052x, a product from Idemitsu Kosan Co., Ltd as guest are deposited by vacuum deposition. This film thickness corresponds to 5% of the total film thickness.

Structural formula (7)

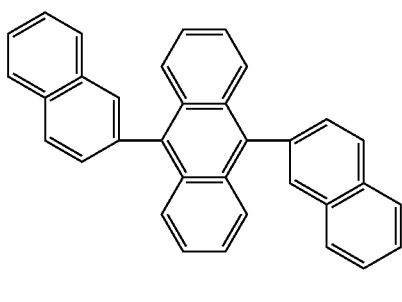

ADN

Finally, the electron transporting layer 14d (18 nm thick) was formed by vacuum deposition using Alq$_3$ (8-hydroxyquinoline aluminum) represented by the structural formula (8).

Structural formula (8)

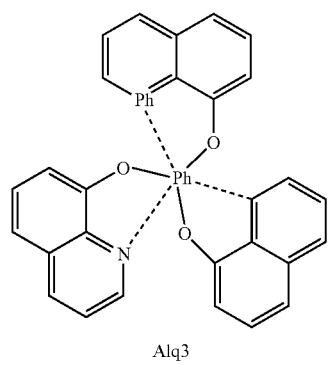

Alq3

The first layer 16a (about 0.3 nm thick) of the cathode 16 was made from LiF by vacuum deposition (at a rate of about 0.01 nm/s), and then the second layer 16b (about 10 nm thick) of the cathode 16 was made from MgAg by vacuum deposition. Thus there was obtained the desirable transmission type display device 10 which is designed such that light radiates through the substrate 12.

Comparative Examples 1 and 2

Samples of display devices were prepared in the same way as in Examples 1 to 3 except that the material for the hole transporting layer 14*b* was replaced by those shown in Table 8. In Comparative Example 1, the hole transporting layer 14*b* (10 nm thick) was formed by vacuum deposition (at a rate of 0.2 to 0.4 nm/s) from HT-320, a product from Idemitsu Kosan Co., Ltd. HT-320 is a material capable of hole transporting. In Comparative Example 2, the hole transporting layer 14*b* (10 nm thick) was formed by vacuum deposition (at a rate of 0.2 to 0.4 nm/s) from α-naphthylphenyldiamine represented by the structural formula (9) below. α-NPD is a material capable of hole transporting.

Structural formula (9)

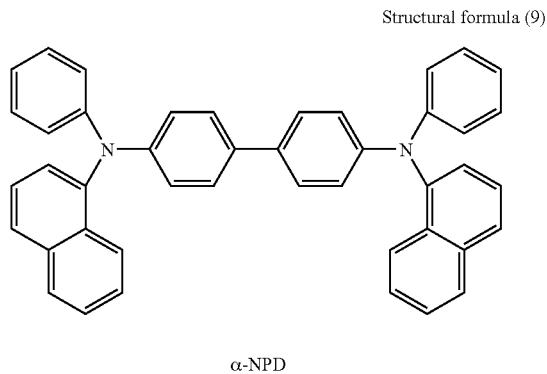

α-NPD

Results of Evaluation (1)

Figure 5:
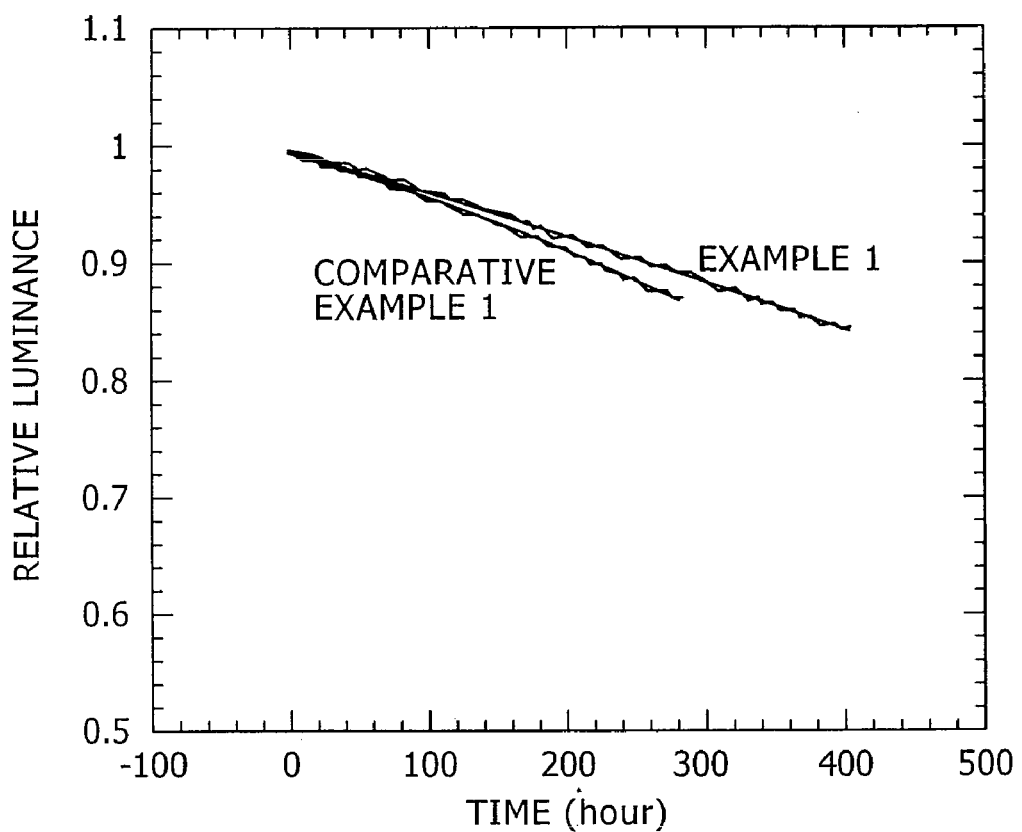
FIG. 5 is a graph showing how the display devices in Example 1 and Comparative Example 1 change in relative luminance with time.
Figure 5:
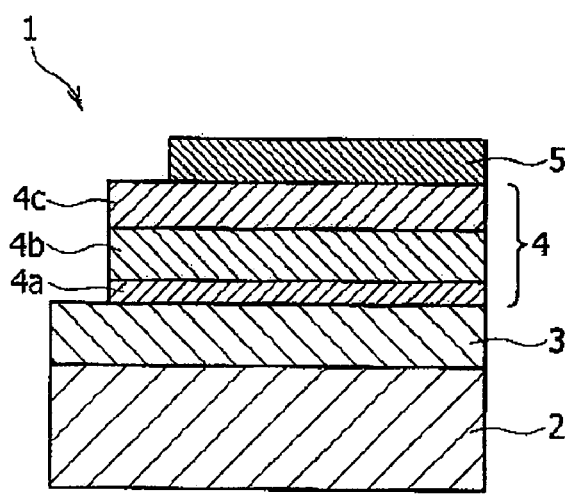

The samples of the display devices prepared in Example 1 and Comparative Example 1 were tested for change with time in luminance. FIG. 5 shows the test result, in which the relative luminance is plotted against time, with the initial luminance being 1. The display devices were driven at a constant current of 70 mA/cm$^2$, with the duty factor being 50. Example 1 in FIG. 5 is representative of Examples 1 to 3, which produced the same results.

It is noted from the foregoing results that the display device in Example 1 is less liable to deterioration (and excellent in long-term reliability) than that in Comparative Example 1, owing to the hole transporting layer 14*b* made from the organic material represented by the structural formula (3), which belongs to the organic materials represented by the formula (1). It is also noted that the display devices in Examples 1 to 3 are nearly comparable in initial luminance to that in Comparative Example 1.

Examples 4 to 6

Samples of the display device 11 (or 11'), which is constructed as explained above with reference to FIG. 2 (or FIG. 3), were prepared in the following manner. Each of them employs the material shown in Table 9 below for the hole transporting layer 14*b* in the emitting units 14-1 and 14-2.

TABLE 9

|  | Hole transporting layer 14b | Charge generating layer 15 (15') | Relative luminance (initial) to comparative example 3 |
|---|---|---|---|
| Example 4 | Structural formula (3) | Li$_2$SiO$_3$/structural formula (6)-10 | 1 |
| Example 5 | Structural formula (4) | LiF/MgAg/structural formula (6)-10 | 0.97 |

TABLE 9-continued

|  | Hole transporting layer 14b | Charge generating layer 15 (15') | Relative luminance (initial) to comparative example 3 |
|---|---|---|---|
| Example 6 | Structural formula (5) | LiF/MgAg/structural formula (6)-10 | 0.96 |
| Comparative Example 6 | HT-320 | Li$_2$SiO$_3$/structural formula (6)-10 | 1 |

A 30 mm square of glass substrate was coated with an ITO film (about 100 nm thick) as the anode 13. The anode 13 was covered with an insulating film of SiO$_2$ (not shown) by vapor deposition excluding 2 mm square of emitting region. Thus a cell for an organic electroluminescence element is obtained.

Next, the first emitting unit 14-1 having the hole transporting layer 14*b* was formed which is constructed as in Example 1. In Examples 4 to 6, the hole transporting layer 14*b* (15 nm thick) was made from each of the organic materials which are represented respectively by the structural formulas (4), (5), and (6). The hole injection layer 14*a* (15 nm thick) was made from HI-406. It is to be noted that the hole injection layer 14*a* and the hole transporting layer 14*b* in Examples 4 to 6 are thicker than those in Example 1.

Then, the charge generating layer 15 (or 15') consisting of two or three sublayers was formed by vapor deposition from the materials shown in Table 9. In Example 4, the intermediate cathode layer 15*a* (1.5 nm thick) was made from Li$_2$SiO$_3$ and the intrinsic charge generating layer 15*b* (2 nm thick) was made from the organic compound represented by the structural formula (6)-10 shown in Table 1. In Examples 5 and 6, the fluoride layer 15*a*-1 was made from LiF, the conducting layer 15*a*-2 was made from MgAg (10:1), and the intermediate cathode layer 15*a* was made from Li$_2$SiO$_3$.

In Examples 4 to 6, the second layer emitting unit 14-2 was formed in the same way as the first emitting unit 14-1.

The first layer 16*a* (about 0.3 nm thick) of the cathode 16 was made from LiF by vacuum deposition (at a rate of about 0.01 nm/s), and then the second layer 16*b* (about 10 nm thick) of the cathode 16 was made from MgAg by vacuum deposition, and finally the third layer 16*c* (about 300 nm thick) of the cathode 16 was made from Al. Thus there was obtained the desired display device 11 (or 11') of transmission type which is designed such that light radiates through the substrate 12.

Comparative Example 3

A stacked type display device was prepared in which the same emitting units as in Comparative Example 1 are laminated with the charge generating layer 15 (the same one as formed in Example 4) interposed between them. That is, the same procedure as in Example 4 was repeated except that the organic material represented by the structural formula (3) above used for the hole transporting layer 14*b* was replaced by HT-320, a product from Idemitsu Kosan Co., Ltd.

Results of Evaluation (2)

The samples of the display devices prepared in Examples 4 to 6 and Comparative Example 3 were tested for change with time in luminance. The results are almost identical with those shown in FIG. 5, in which the relative luminance is plotted against time, with the initial luminance being 1. The display devices were driven at a constant current of 70 mA/cm$^2$, with the duty factor being 50.

It is noted from the foregoing results that the stacked type display device in Example 4 is less liable to deterioration (and excellent in long-term reliability) than that in Comparative Example 3, owing to the hole transporting layer 14b made from the organic material represented by the structural formula (3) above, which belongs to the organic materials represented by the formula (1) above. It is also noted from Table 9 that the display devices in Examples 4 to 6 are nearly comparable in initial luminance to that in Comparative Example 3.

Moreover, it was found that the stacked type display devices in Examples 4 to 6 (in which the emitting units includes two layers) are 1.8 to 1.0 times better in emitting efficiency than the display devices in Examples 1 to 3 (in which the emitting unit includes only one layer). This result suggests that the stacked type contributes to long-term reliability if the initial luminance is the same.

What is claimed is:

1. A display device having:
    a cathode;
    an anode;
    at least two light emitting units in between said cathode and said anode, each of said light emitting units includes a hole injection layer, a hole transporting layer, an organic light emitting layer and an electron transporting layer; and
    a charge generating layer interposed between each of the light emitting units,
    wherein,
        at least either a hole transporting layer or a hole injection layer contains an organic material represented by the formula 1 below:

formula 1

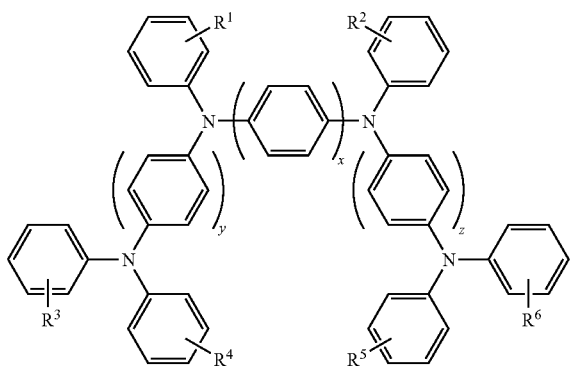

where x denotes an integer of 4 to 6, y and z each denotes an integer of 1 to 6, and $R^1$ to $R^6$ each independently denotes a $C_{1-6}$ alkyl group or a $C_{5-6}$ cycloalkyl group.

2. The display device as defined in claim 1, wherein the light emitting unit has a mixture layer containing the organic material represented by the formula 1 and any other organic material.

3. The display device as defined in claim 1, wherein the charge generating layer contains at least either an alkali metal oxide or an alkaline earth metal oxide.

4. The display device as defined in claim 3, wherein the charge generating layer includes an interface layer on the side of the charge generating layer that faces the cathode and is made of an organic material having a phthalocyanine skeleton.

5. The display device as defined in claim 3, wherein the charge generating layer is an insulating layer.

6. The display device as defined in claim 3, wherein the charge generating layer contains an organic compound represented by the formula 2 below:

formula 2

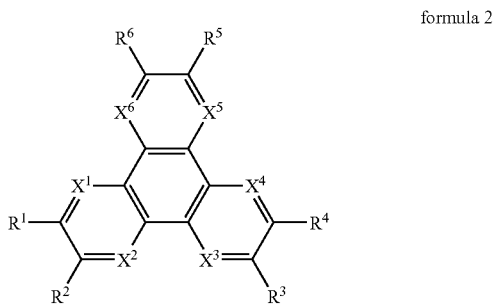

where each of $R^1$ to $R^6$ is a substituent group selected from hydrogen, halogen, hydroxyl group, amino group, arylamino group, substituted or unsubstituted carbonyl group with a carbon number no larger than 20, substituted or unsubstituted carbonyl ester group with a carbon number no larger than 20, substituted or unsubstituted alkyl group with a carbon number no larger than 20, substituted or unsubstituted alkenyl group with a carbon number no larger than 20, substituted or unsubstituted alkoxyl group with a carbon number no larger than 20, substituted or unsubstituted aryl group with a carbon number no larger than 30, substituted or unsubstituted heterocyclic group with a carbon number no larger than 30, nitrile group, nitro group, cyano group, and silyl group, of the groups $R^1$ to $R^6$, adjacent groups $R^m$, where m=1 to 6 may be joined together through a cyclic structure, each of $X^1$ to $X^6$ is a carbon or nitrogen atom and where at least one of $X^1$ to $X^6$ is a carbon atom.

7. The display device as defined in claim 6, wherein the charge generating layer includes an interface layer having the metal oxide at the side of the anode and a genuine charge generating layer having the organic compound adjacent to the interface layer.

8. The display device as defined in claim 1, wherein the charge generating layer includes an interface layer having at least either alkali metal fluoride or alkaline earth metal fluoride at the side of the anode.

9. The display device as defined in claim 8, wherein the interface layer includes a first layer having a conductive material and a second layer having at least either alkali metal fluoride or alkaline earth metal fluoride, said second layer being arranged near the anode.

10. The display device as defined in claim 9, wherein the first layer contains at least any one of magnesium, silver, and aluminum.

11. The display device as defined in claim 8, wherein the charge generating layer includes an interface layer on the side of the charge generating layer that faces the cathode and is made of an organic material having a phthalocyanine skeleton.

12. The display device as defined in claim 8, wherein the charge generating layer is an insulating layer.

13. The display device as defined in claim 8, wherein the charge generating layer contains an organic compound represented by a formula 2 below:

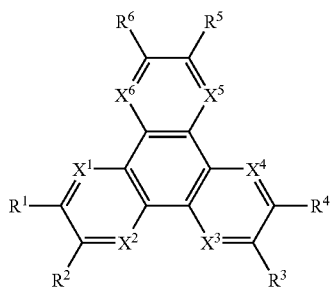

formula 2 where each of $R^1$ to $R^6$ is a substituent group selected from hydrogen, halogen, hydroxyl group, amino group, arylamino group, substituted or unsubstituted carbonyl group with a carbon number no larger than 20, substituted or unsubstituted carbonyl ester group with a carbon number no larger than 20, substituted or unsubstituted alkyl group with a carbon number no larger than 20, substituted or unsubstituted alkenyl group with a carbon number no larger than 20, substituted or unsubstituted alkoxyl group with a carbon number no larger than 20, substituted or unsubstituted aryl group with a carbon number no larger than 30, substituted or unsubstituted heterocyclic group with a carbon number no larger than 30, nitrile group, nitro group, cyano group, and silyl group, of the groups $R^1$ to $R^6$, adjacent ones $R^m$, where m=1 to 6 may be joined together through a cyclic structure, where each of $X^1$ to $X^6$ is a carbon or nitrogen atom and where at least one of $X^1$ to $X^6$ is a carbon atom.

14. The display device as defined in claim 13, wherein the charge generating layer includes an intrinsic charge generating layer having an organic compound, the intrinsic charge generating layer adjacent to the interface layer.

15. The display device as defined in claim 14, wherein the charge generating layer includes a mixture layer containing at least either alkali metal or alkaline earth metal and the intrinsic charge generating layer containing an organic material represented by a formula 2:

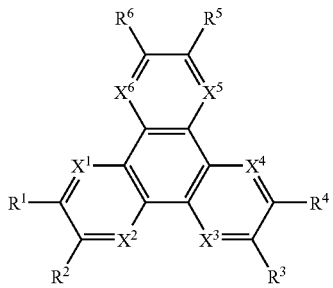

formula 2 where each of $R^1$ to $R^6$ is a substituent group selected from hydrogen, halogen, hydroxyl group, amino group, arylamino group, substituted or unsubstituted carbonyl group with a carbon number no larger than 20, substituted or unsubstituted carbonyl ester group with a carbon number no larger than 20, substituted or unsubstituted alkyl group with a carbon number no larger than 20, substituted or unsubstituted alkenyl group with a carbon number no larger than 20, substituted or unsubstituted alkoxyl group with a carbon number no larger than 20, substituted or unsubstituted aryl group with a carbon number no larger than 30, substituted or unsubstituted heterocyclic group with a carbon number no larger than 30, nitrile group, nitro group, cyano group, and silyl group, of the groups $R^1$ to $R^6$, adjacent ones $R^m$, where m=1 to 6 may be joined together through a cyclic structure, each of $X^1$ to $X^6$ is a carbon or nitrogen atom, and where at least one of $X^1$ to $X^6$ is a carbon atom.

16. The display device as defined in claim 15, wherein the percentage of at least either alkali metal or alkaline earth metal in the mixture layer is not over 50%.

17. The display device as defined in claim 15, wherein the charge generating layer includes an interface layer having at least either alkali metal fluoride or alkaline earth metal fluoride at the side of the anode.

18. The display device as defined in claim 15, wherein the charge generating layer includes an interface layer on the side of the charge generating layer that faces the cathode and is made of an organic material having a phthalocyanine skeleton.

* * * * *